United States Patent

Nakagawa et al.

[11] Patent Number: 5,950,148
[45] Date of Patent: *Sep. 7, 1999

[54] APPARATUS AND METHOD FOR MAINTAINING AND CONTROLLING ELECTRONIC APPARATUS PROVIDED WITH COMMUNICATION FUNCTION

[75] Inventors: Takashi Nakagawa; Yoshiteru Mori; Tadashi Okada, all of Nara; Shinichi Takeda, Osaka; Takao Fukuda; Tuyoshi Higaki, both of Yamatokoriyama; Noriyuki Hoshiai, Kyoto, all of Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/716,625

[22] Filed: Sep. 19, 1996

[30] Foreign Application Priority Data

Sep. 19, 1995 [JP] Japan ..................................... 7-239542

[51] Int. Cl.⁶ .................................................... G06F 11/30
[52] U.S. Cl. .................... 702/182; 364/138; 340/825.06; 358/434; 358/468
[58] Field of Search ..................................... 364/550, 130, 364/138; 358/404, 434, 438, 439, 468; 340/825.06, 825.15; 399/81; 355/200, 202, 203, 204–206; 702/182

[56] References Cited

U.S. PATENT DOCUMENTS 5,243,382  9/1993  Takano et al. .......................... 355/207
5,282,127  1/1994  Mii .......................................... 364/130

FOREIGN PATENT DOCUMENTS 0717322   6/1996   European Pat. Off. .
2126357   5/1990   Japan .
3196053   8/1991   Japan .
3226770  10/1991   Japan .
3226771  10/1991   Japan .

Primary Examiner—John Barlow
Assistant Examiner—Kamini Shah

[57] ABSTRACT

The invention is capable of displaying to an operator a guidance for performing an accurate operation in accordance with a state of a copying machine, and at the same time the invention does not require a huge volume memory and a processor for analyzing data in the portable terminal device with the result that the cost can be reduced and the device of the invention can be reduced in size. The portable terminal device is provided for the display and input reception of the maintenance control data in such a manner the portable terminal device can be connected to the copying machine. The maintenance control data is transmitted and received to and from the host computer and the portable terminal device via the copying machine.

8 Claims, 15 Drawing Sheets

FIG.5A

| IDENTIFICATION DATA | OPERATION HISTORY | MAINTENANCE HISTORY |
|---|---|---|
| SD-2060.00001 | ...... | ...... |
| SD-2060.00002 | ...... | ...... |
| SD-2060.00003 | ...... | ...... |
| SD-2060.00004 | ...... | ...... |
| SF-2050.00001 | ...... | ...... |
| SF-2050.00002 | ...... | ...... |

FIG.5B

| TYPE | ITEM DATA D1 | ITEM DATA D2 | STATE DATA | GUIDANCE DATA | COUNT NECESSARY FOR MAINTENANCE |
|---|---|---|---|---|---|
| SD-2060 | PAPER-FEEDING PART | ADJUSTMENT OF BLOW-OUT AIR PRESSURE | | (ADJUSTMENT METHOD) | PAPER-FEEDING COUNTER VALUE : 20000 |
| | | ADJUSTMENT OF SUCTION AIR PRESSURE | | (ADJUSTMENT METHOD) | |
| | | | CLEANING OF PAPER-FEEDING ROLLER | (CLEANING METHOD) | |
| | OPTICAL PART | | | | |
| SF-2050 | PAPER-FEEDING PART | | | | |

FIG. 7A

```
                        34
SD-2060   MAINTENANCE ITEMS
1 PAPER-FEEDING PART
  ·ADJUSTMENT OF BLOW-OUT AIR PRESSURE
  ·ADJUSTMENT OF SUCTION AIR PRESSURE
  ·EXCHANGE OF PAPER-FEEDING BELT
```

FIG. 7B

```
                        34
SD-2050   MAINTENANCE ITEMS
1 PAPER FEEDING PART
  ·CLEANING/EXCHANGE OF PICK-UP ROLLER
  ·CLEANING/EXCHANGE OF PAPER-FEEDING ROLLER
  ·CLEANING/EXCHANGE OF REVERSE ROLLER
```

FIG. 7C

```
                        34
SD-2050   MAINTENANCE ITEMS
1 PAPER-FEEDING PART
  ·CLEANING OF PICK-UP ROLLER
  ·PAPER-FEEDING ROLLER
  ·EXCHANGE OF REVERSE ROLLER
```

FIG. 7D

```
                        34
SD-2050   MAINTENANCE ITEMS
1 PAPER-FEEDING PART
  ·CLEANING OF PICK-UP ROLLER
  ·CLEANING OF PAPER-FEEDING ROLLER
  ·CLEANING OF REVERSE ROLLER
```

SD-2060   MAINTENANCE ITEMS

1. ADJUSTMENT OF INITIAL IMAGE QUALITY

2. ADJUSTMENT OF PAPER-FEEDING PART

3. EXCHANGE OF DEVELOPER

4. EXCHANGE OF DRUM

5. CLEANING OF OPTICAL PART

SELECT ITEMS (1-5)
```

ADJUSTMENT OF IMAGE QUALITY

1. EXECUTE PROGRAM

2. CONFIRM THAT COPIED IMAGE OF "B" OVERLAPS BY USING IMAGE ADJUSTMENT CHART

3. IN THE BRIGHT CASE, VARIABLE IS SET TO SMALLER VALUE AND IN THE DARK CASE, VARIABLE IS SET TO LAGER VALUE.

INPUT RANGE IS REPRESENTED BY 00~99

4  A B C D E F G

OVERLAPS
SLIGHTLY OVERLAPS
DO NOT OVERLAP

34

CHECK CODE DOES NOT AGREE

DO NOT PERFORM MAINTENANCE

FIG.16A

```
         SD-2060   MAINTENANCE ITEMS
1. EXCHANGE OF DEVELOPER
2. EXCHANGE OF DRUM
3. CLEANING OF OPTICAL PARTS
IN CASE OF SUSPENSION,
PRESS "SUSPENSION" KEY
```
~34

FIG.16B

```
     SD-2050   MAINTENANCE

EXCHANGE OF DEVELOPER ENDED? (Y/N)
```
~34

FIG.16C

```
       SD-2060   MAINTENANCE ITEMS
1. EXCHANGE OF ONE DRUM
2. CLEANING OF OPTICAL PARTS
IN CASE OF SUSPENSION,
PRESS "SUSPENSION" KEY
```
~34

FIG.16D

```
     SD-2050   MAINTENANCE

SUSPEND MAINTENANCE? (Y/N)
```
~34

FIG.16E

```
       SD-2060   MAINTENANCE ITEMS
MAINTENANCE OPERATION REMAINS
1. EXCHANGE OF DRUM
2. CLEANING OF OPTICAL PARTS
REMOVE TERMINAL DEVICE FROM
COPYING MACHINE
```
~34

APPARATUS AND METHOD FOR MAINTAINING AND CONTROLLING ELECTRONIC APPARATUS PROVIDED WITH COMMUNICATION FUNCTION

BACKGROUND OF THE INVENTION

1. Field of the Invention

The present invention relates to an apparatus and method for maintaining and controlling an electronic apparatus such as image forming apparatuses which include copying machines and printers, and more particularly to an apparatus and method for maintaining and controlling an electronic apparatus provided with a communication function and thereby capable of transmitting and receiving data via a data communication circuit.

2. Description of the Related Art

There is available a maintenance control system for image forming apparatuses, the system being constituted in such a manner that a host computer is installed in a control center where a service man is waiting and the host computer is connected to the image forming apparatuses of users via a data communication circuit such as a public telephone circuit or the like in a quest to heighten the efficiency of maintenance control of the image forming apparatuses. For example, Japanese Unexamined Patent Publication JP-A 3-196053 (1991) discloses a structure of an image forming apparatus such that the image forming apparatus connected to an external device is provided with control means for performing a processing corresponding to a maintenance operation in accordance with a remotely controlled signal which is inputted from the external device.

The external device calls each image forming apparatus connected thereto to cause the image forming apparatus to perform an operation for the maintenance control. Since information in the image forming apparatus is sent to the external devices an operator can grasp on the external device a judgment as to whether the maintenance operation is needed, as well as information on parts and tools required for the maintenance operation. Therefore, the operator can go to a place where the image forming apparatus is installed after preparing for parts and tools required for the operation so that he can perform the maintenance operation without fail.

In addition, there is proposed a transferable-type operation terminal device which is constituted so that data which is accumulated in an image forming apparatus is read so that the read data is used for the maintenance operation of the image forming apparatus. For example, Japanese Unexamined Patent Publications JP-A 3-226770 and JP-A 3-226771 disclose a portable terminal device for the maintenance control, the device being constituted so as to display a guidance of the most appropriate operation procedure on the basis of state data which is read and is indicative of an operation state of the image forming apparatus and auxiliary data on the operation state, the auxiliary data being obtained directly from the image forming apparatus by the service man. In the maintenance control of the image forming apparatus using the portable terminal device, a service man causes the portable terminal device to read guide data from a host computer at the control center before going to the image forming apparatus on the hand of users. Next, after arriving at the side of the users, the service man connects the portable terminal device to the image forming apparatus, and causes the portable terminal device to read the state data from the image forming apparatus. At the same time, the service man enters information detected by the service man himself to the portable terminal device as auxiliary data. The portable terminal device displays the guidance of the maintenance operation in accordance with the state of the image forming apparatus by referring to the state data, the auxiliary data and the guide data. The service man can perform the maintenance operation in accordance with the guidance displayed on the portable terminal device. In addition, the service man can easily grasp detailed information on an operation state of the image forming apparatus which will be required at the time of performing the maintenance control of the image forming apparatus.

In addition, Japanese Unexamined Patent Publication JP-A 2-126357 (1990) discloses a structure of a system which is connected to a host to maintain a terminal, the system comprising:

a data writing part for adding a code to various data on service maintenance which data is accumulated in a memory device of the host, the code being indicative of whether or not transmission is allowed to the terminal connected to the host;

an identifying part for identifying an ID code for specifying the terminal;

a judging part for judging whether or not the same terminal having the ID code written therein accesses for writing a code. With such a structure, only the terminal having the data written therein is allowed to perform the transmission with respect to individual item of data. Consequently, since only the maintenance data corresponding to each terminal is allowed to be transmitted with respect to individual maintenance data in a database in the host, an access to the maintenance data on other terminals is inhibited so that the secrecy can be heightened.

Furthermore, Japanese Patent Application 6-307726 discloses a structure of a device which is constituted to provide an instruction for operating a copying machine through an operation key on a portable terminal, wherein the copying machine incorporates a program for the portable terminal, the aforementioned program is transmitted to the portable terminal by using an infrared ray or the like, and the portable terminal provides an instruction for an operation by using this program. Internal information such as a state of the attachment of options and a state of an error generation is transmitted to the portable terminal. Since the program for an operation instruction is incorporated in the copying machine side, it is not necessary to renew the program depending on the type of the copying machine.

However, in a structure disclosed in JP-A 3-196053, there is a problem in that data is limited which can be output from an image-forming apparatus to an external device, an intricate state of the image forming apparatus at the time of maintenance operation cannot be sufficiently grasped, and the maintenance operation cannot be performed accurately in accordance with the state of the image forming apparatus.

Furthermore, in structures disclosed in JP-A 3-226770 and JP-A 3-226771, all the guide data on the maintenance operation of an image forming apparatus is required to be memorized in a portable terminal device for selecting and displaying a guidance in accordance with auxiliary data input by a service man. At the same time, the maintenance operation is required to be selected and performed depending on the state of the image forming apparatus by referring to the state data, the auxiliary data and the guide data. The portable terminal device is required to be provided with large capacity memory means and processing means for analyzing data thereby inviting a rise in the production cost and an enlargement in the size of the apparatus itself. In particular, to allow the portable terminal device to be compatible with all the types of image forming apparatus, a larger amount of memory capacity is required in the portable terminal device.

Furthermore, in a structure disclosed in JP-A 2-126357, when an access is allowed, maintenance data is transmitted from a memory device of a host to a terminal. Since the data is transmitted only at the terminal, it is necessary to provide a connection function with a circuit on the terminal.

Furthermore, in a structure disclosed in Japanese Patent Application 6-307726, internal information of a copying machine is given to a portable terminal when the copying machine is operated by using the portable terminal. Since an instruction for operating the copying machine is provided on the basis of a transmitted program and the internal information at the portable terminals a large amount of calculations must be performed with processing means for analyzing data at the portable terminal.

SUMMARY OF THE INVENTION

An object of the invention is to provide an apparatus and method for maintaining and controlling an electronic apparatus provided with a communication function, the apparatus and method being capable of displaying to an operator a guidance for performing an accurate operation depending on a state of the electronic apparatuses while allowing a portable terminal device to be free of a need of a large capacity memory device and processing means for analyzing data thereby making it possible to reduce the cost and the size of the portable terminal device.

The invention provides a maintenance control apparatus for an electronic apparatus provided with a communication function, the maintenance control apparatus comprising:

central control means for holding maintenance control information on the electronic apparatus which is to be identified in accordance with predetermined information which means can be connected to the electronic apparatus via a data communication circuit; and portable terminal means having:

connecting means which can be connected to the electronic apparatus which is to be maintained and controlled, detecting means for detecting identification information of the electronic apparatus and information on an operation state of the electronic apparatus, in a connected state, transmitting means for transmitting the detected information to the central control means via the communication function of the electronic apparatus, receiving means for receiving the maintenance control information with respect to the electronic apparatus via the communication function from the central control means, and display means for displaying the received information.

According to the invention, the central control means can be connected to the electronic apparatus provided with the communication function via the data communication circuit, and holds the maintenance control information with respect to the electronic apparatus which is identified in accordance with the predetermined information. In a state in which the portable terminal means is connected to the electronic apparatus, the portable terminal means detects the identification information and the information on an operation state by using the detecting means so that the portable terminal device transmits the detected information to the central control means via the communication function of the electronic device with the transmitting means. The central control means transmits the maintenance control information with respect to the electronic Apparatus to which the portable terminal means is connected on the basis of the information sent from the portable terminal means. The portable terminal means receives the maintenance control information with the receiving means via the communication function and displays the received information on the display means. An operator who performs a maintenance control operation performs the maintenance control operation on the basis of the information which is displayed on the portable terminal means. As a consequences the maintenance control information to which the operator refers at the time of performing the maintenance control operation is sent to the portable terminal means on the basis of the identification information and the information on the operation state of the electronic apparatus which information is sent to the central control means via the electronic apparatus to the central control means with the result that the maintenance control information is not required to be memorized in the portable terminal means and the memory capacity of the portable terminal means can be reduced. In addition, the maintenance control information required at the time of performing the maintenance control operation is judged by the central control means so that the portable terminal means is not required to be provided with processing means for analyzing the information so that the cost of parts of the portable terminal means can be reduced. Furthermore, the operation state of the electronic apparatus which the operator obtained at the time of the maintenance control operation is sent from the portable terminal means to the central control means together with the identification information of the electronic apparatus. Then the maintenance control information is sent on the basis of the operation state and the identification information. As a consequence, the maintenance control operation can be performed in accordance with the state of the electronic apparatus, and an attempt can be made to shorten operation time for the maintenance control and to improve the reliability thereof. In addition, the portable terminal means exchanges information with the central control means via the communication function of the electronic apparatus so that the portable terminal device may be provided with a function of transmitting and receiving information between the electronic apparatus and the portable terminal means. The portable terminal device is not required to be provided with a function for connecting to the data communication circuit so that the cost of parts of the portable terminal means can be reduced.

The invention is characterized in that the maintenance control information held in the central control means is classified for each function of the electronic apparatus, the data for selecting the maintenance control information is given from the transmitting means of the portable terminal means to the central control means, and the maintenance control information selected by the data is given from the central control means to the portable terminal means.

According to the invention, the maintenance control information is classified for each function of the electronic apparatus, and is held in the central control means. When the data for selecting the maintenance control information is given from the transmitting means of the portable terminal means to the central control means, the maintenance control information selected by the data is given from the central control means to the portable terminal means. Consequently, with respect to the maintenance control operation whose operation procedure is unclear to the operator, the maintenance control information is provided from the central control means so that the operator can perform the maintenance control operation with certitude by referring to the maintenance control information.

The invention is characterized in that the maintenance control information held in the central control means is classified in stages according to an operation level determined for each operator who is to perform the maintenance control operation, and the maintenance control information corresponding to the operation level of the operator who is to perform the maintenance control operation is given to the portable terminal means via the communication function of the electronic apparatus.

According to the invention, the maintenance control information held in the central control means is classified in stages according to the operation level determined for each operator who is to perform the maintenance control operation, and the maintenance control information corresponding to the operation level of the operator is given to the portable terminal via the communication function of the electronic apparatus. Consequently, the operator can refer to the maintenance control information corresponding to his own operation level. In other words, it is possible to prevent too detailed maintenance control information from being given to the operator whose operation level is high so that time and cost for communicating information is not spent more than needed. On the other hand, it is also possible to prevent the shortage of information required for the maintenance control operation on the side of the operator whose operation level is low.

The invention is characterized in that one or a plurality of maintenance control information items which are to be maintained and controlled are given to the portable terminal means so that end information is given to the central control means, the end information being indicative of the end of the operation for each time of the end of the maintenance control operation corresponding to the maintenance control information, and whether or not the maintenance control operation which is to be performed has been ended is controlled by the central control means.

According to the present invention, one or plurality of maintenance information items are given to the portable terminal means. The end information indicative of the end of the operation is given to the central control means at each time of ending the maintenance control operation corresponding to the maintenance control operation so that the central control means provides a control of whether or not the maintenance control operation has been ended which should be performed. Consequently, even when the maintenance control operation which should be performed ranges over a large number of items, all the items of the operation can be performed with certitude.

The invention provides a method for maintaining and controlling an electronic apparatus provided with a communication function, comprising the steps of:

providing central control means for holding maintenance control information on the electronic apparatus which is identified in accordance with predetermined information which means can be connected to the electronic apparatus via a data communication circuit;

connecting portable terminal means to the electronic apparatus to be maintained and controlled to detect identification information and information in relation to an operation state of the apparatus;

transmitting the detected information to the central control means via the communication function of the electronic apparatus; and receiving the maintenance control information on the electronic apparatus which is transmitted from the central control means by receiving means via the communication function to display in images.

The present invention is characterized in that the identification information of the electronic apparatus which will be an object of maintenance control is read from the central control means before the connection of the portable terminal means to the electronic apparatus to memorize in the portable terminal means and the performance of the maintenance control operation is allowed when the identification number attached to the electronic apparatus to which the portable terminal means is connected agrees with the identification number memorized in the portable terminal means.

According to the invention, the identification information of the electronic apparatus which is an object of the maintenance control is read from the central control means, and is memorized in the portable terminal means before the connection of the portable terminal means to the electronic apparatus. When the identification number attached to the electronic apparatus to which the portable terminal means is connected agrees with the identification number memorized in the portable terminal means, the performance of the maintenance control operation is allowed. Consequently, the maintenance control operation can be prevented from being performed with respect to the electronic apparatus other than the electronic apparatus with which the maintenance control operation is performed in advance, and the performance of an unnecessary operation can be prevented.

As described above, according to the invention, the maintenance control information to which the operator refers at the time of performing the maintenance control operation is transmitted to the central control means on the basis of the identification information of the electronic apparatus which information is transmitted from the portable terminal means to the central control means via the electronic apparatus and on the basis of information on the operation state so that the maintenance control information is not required to be memorized in the portable terminal means, and the memory capacity of the portable terminal means can be reduced. Besides, since the maintenance control information required at the time of performing the maintenance control operation is judged at the central control means, no means is required to be provided on the portable terminal means for dealing with the analysis of the information so that the cost of parts of the portable terminal means can be reduced. Furthermore, the operation state of the electronic apparatus which the operator has learned during the operation is transmitted from the portable terminal means to the central control means together with the identification information of the electronic apparatus, and the maintenance control information is transmitted on the basis of the operation state and the identification information with the result that the maintenance control operation can be performed in accordance with the state of the electronic apparatus, the operation time for the maintenance control operation can be shortened and an attempt can be made to improve the reliability thereof. Furthermore, since the portable terminal means exchanges information with the central control means via the communication function of the electronic apparatus, a function of transmitting and receiving information with the electronic apparatus may be provided, no function of connecting the portable terminal device to the data communication circuit is required to be provided so that the cost of parts of the portable terminal means can be reduced.

Furthermore, according to the invention, since the operator can refer to the desired maintenance control information by providing data for selecting the maintenance control information from the portable terminal means to the central control means with respect to the maintenance control operation whose operation procedure is unclear to the operator, the operator can perform the maintenance control operation with certitude.

Furthermore, according to the invention, since the maintenance control information corresponding to the operation level of the operator is given to the portable terminal means via the communication function of the electronic apparatus, the operator can refer to the maintenance control information corresponding to his own operation level thereby making an attempt of uniforming the quality of the maintenance control operation.

Furthermore, according to the invention, it is judged whether the identification information of the electronic apparatus which is an object of the maintenance control agrees with the identification number attached to the electronic apparatus to which the portable terminal means is connected, the information being memorized in the portable terminal means in advance. Since the maintenance control operation is performed only when the identification information agrees with the identification number, the maintenance control operation is prevented from being performed with respect to the electronic apparatus other than the electronic apparatus to which the maintenance control operation is directed, and the performance of an unnecessary operation can be prevented.

Furthermore, according to the invention, the end information indicative of the end of the operation is given to the central control means every at each time of ending the maintenance control operation corresponding to the maintenance control information so that the central control means provides a control of whether or not the maintenance control operation has been ended which should be performed. Consequently, even when the maintenance control operation ranges over a large number of items, all the operations can be performed with certitude. Even in the case where part of the maintenance control operation which is to be performed cannot be performed owing to a failure of parts and tools at the time of performing the maintenance control operation, the operation can be easily transferred to a different person.

BRIEF DESCRIPTION OF THE DRAWINGS

Other and further objects, features, and advantages of the invention will be more explicit from the following detailed description taken with reference to the drawings wherein:

FIG. 5A shows data for each copying machine 1 out of maintenance data stored in a memory 42 of the host computer 40;

FIG. 5B shows data for each type of copying machine 1 out of the maintenance data;

FIGS. 7A to 7D are views showing a display example of a portable terminal device 30 at the time of the maintenance control operation in the maintenance control apparatus of the first embodiment;

FIG. 9 is a view showing a display example of the portable terminal device 30 at the time of the maintenance control operation in the maintenance control apparatus of the second embodiment;

FIGS. 16A to 16E are views showing display examples of the portable terminal device 30 at the time of the maintenance control operation in the maintenance control apparatus of the fifth embodiment.

DETAILED DESCRIPTION OF THE PREFERRED EMBODIMENTS

Figure 1:
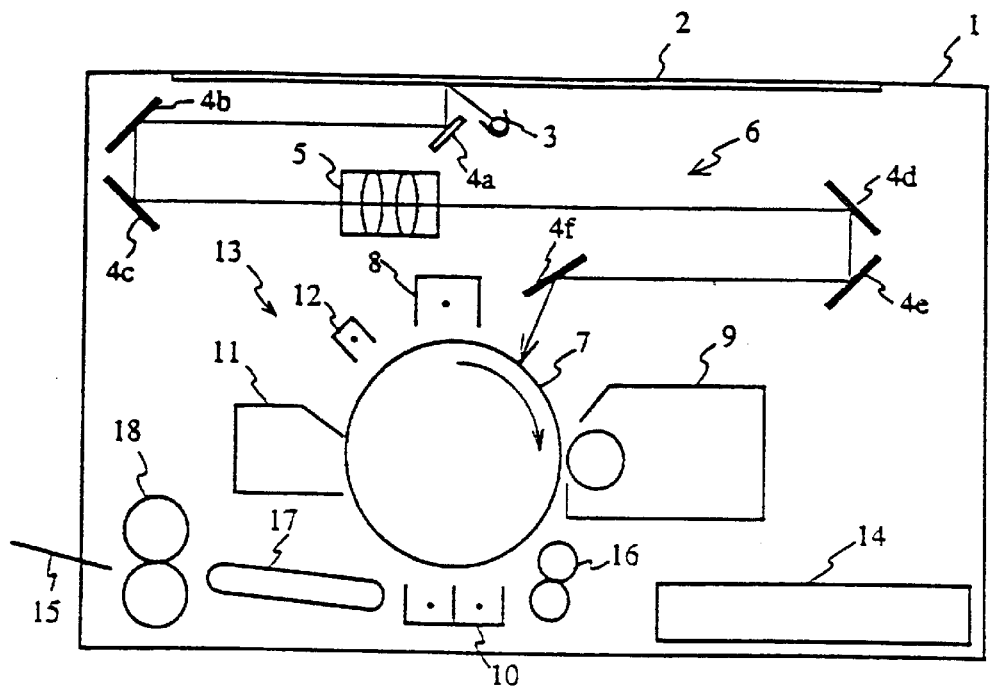
FIG. 1 is a sectional view showing a schematic structure of a copying machine 1 which is incorporated in a maintenance control apparatus of a first embodiment of the invention.

Now referring to the drawings, preferred embodiments of the invention are described below.

FIG. 1 is a schematic sectional view showing a structure of a copying machine which is an electronic apparatus maintained and controlled by a maintenance control apparatus of a first embodiment of the invention. The copying machine 1 provides a manuscript base 2 formed of transparent glass on an upper surface thereof. On an upper part of the inside of the copying machine 1, an optical system unit 6 comprising a copy lamp 3, mirrors 4a through 4f, and a lens 5 is arranged. Furthermore, in the middle part of the inside of the copying machine 1, a photoconductor drum 7, a charger 8, a developer 9, a transcribing device 10, a cleaner 11 and a discharging device 12 constitute a copy processing part 13. On the right side of a lower part of the inside of the copying machine 1, a paper-feeding cassette 14 is attached. On the left side of the copying machine 1 thereof, a paper-discharging tray 15 is attached. A paper-feeding path 19 is constituted which includes a resist roller 16 a paper-feeding belt 17 and a fixing device 18 from the paper-feeding cassette 14 to the paper-discharging tray 15 via the copy processing part 13.

The optical system unit 6 scans an image surface of a manuscript placed on the manuscript base 2 with light emitted from the copy lamp 3. The light reflected by the manuscript with light from the copy lamp 3 exposes a surface of the photoconductor drum 7 via mirrors 4a through 4f and the lens 5. The surface of the photoconductor drum 7 is electrically charged with electrical charges having a single polarity by the charger 8 prior to the exposure by the reflection light coming from the manuscript. Consequently, an electrostatic latent image is formed on the surface of the photoconductor drum 7 as a result of the exposure by the reflection light coming from the manuscript. This electrostatic latent image receives a supply of a developing agent with the developer 9 so that the electrostatic latent image is formed into a visible developing agent image. The rotation of the resist roller 16 causes the paper fed from the paper-feeding cassette 14 prior to the rotation of the photoconductor drum 7 to be fed between the photoconductor drum 7 and the transcribing device 10 in synchronization with the rotation of the photoconductor drum 7. The transcribing device 10 transcribes the developing agent image formed on the surface of the photoconductor drum 7 onto the paper surface. The surface of the photoconductor drum 7 after the end of the transcription process is subjected to a removal of a residual developing agent with the cleaner 11, and a discharge of residual electrical charges with a discharging device 12. On the other hand, after the image is transcribed, the paper is fed to a fixing roller 18 with a paper-feeding belt 17. Then the fixing roller 18 heats and presses the developing agent image transcribed on the paper so that the image is molten and fixed and then is discharged to the paper-discharge tray 15.

Figure 2:
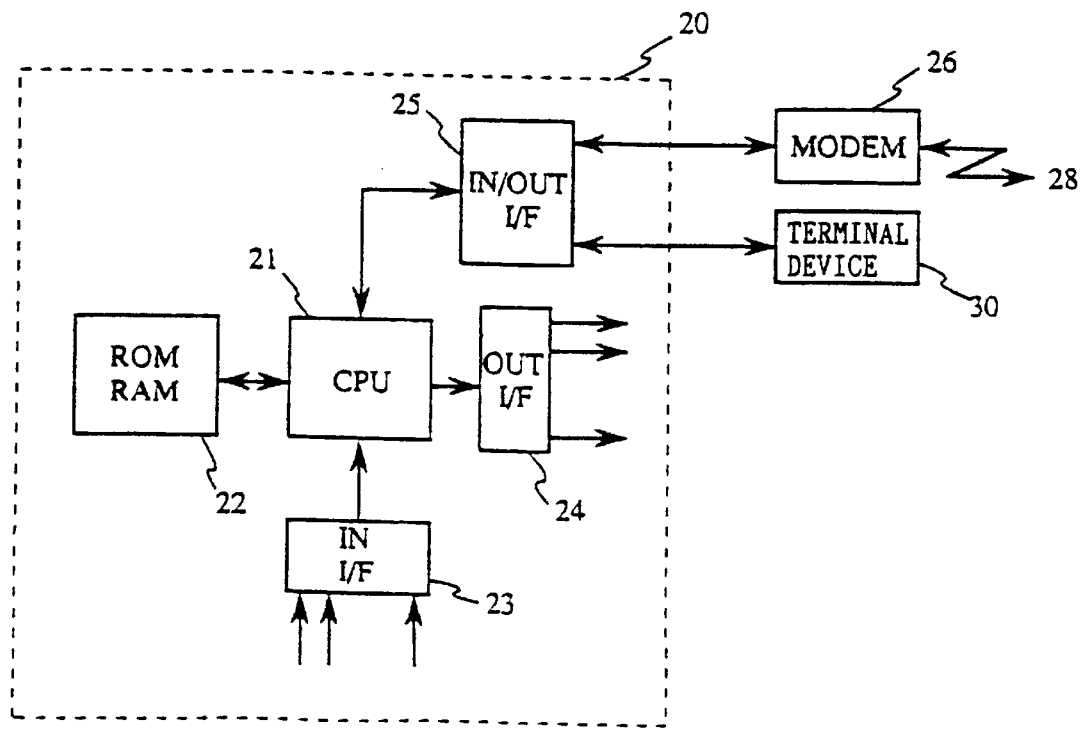
FIG. 2 is a block diagram showing a structure of a control part 20 of the copying machine 1.

FIG. 2 is a block diagram showing a structure of a control part 20 of the copying machine 1. The control part 20 includes a CPU 21 provided with a memory 22 comprising a RAM and a ROM. To the CPU 21, input devices such as each kind of sensor, a key switch or the like are connected via an input interface 23. On the other hand, output devices such as each kind of motor, a solenoid or the like are connected to the CPU 21 via an output interface 24.

As each kind of sensor, a paper detecting sensor, a fixing temperature sensor and the like are provided. The paper detecting sensor is provided on a predetermined position of the paper-feeding path 19 to detect the passage of the paper. The fixing temperature sensor detects a temperature of the fixing roller 18. The copying machine 1 is provided with a plurality of sensors in addition to the paper detecting sensor and the fixing temperature sensor. An output from each sensor is provided to the control part 20 of the copying machine 1.

The CPU 21 drives and controls output devices in accordance with data input from the input devices in accordance with a program which is preliminarily written in the ROM. Furthermore, a modem 26 is connected to an input and output interface 25, and then a portable terminal device 30 which will be described later is connected to the input and output interface 25. The CPU 21 is connected to a public telephone circuit via the input and output interface 25 and the modem 26. A counter is set in a RAM of the memory 22 so that a count number increases every time the paper detecting sensor detects the passage of the paper.

Figure 3:
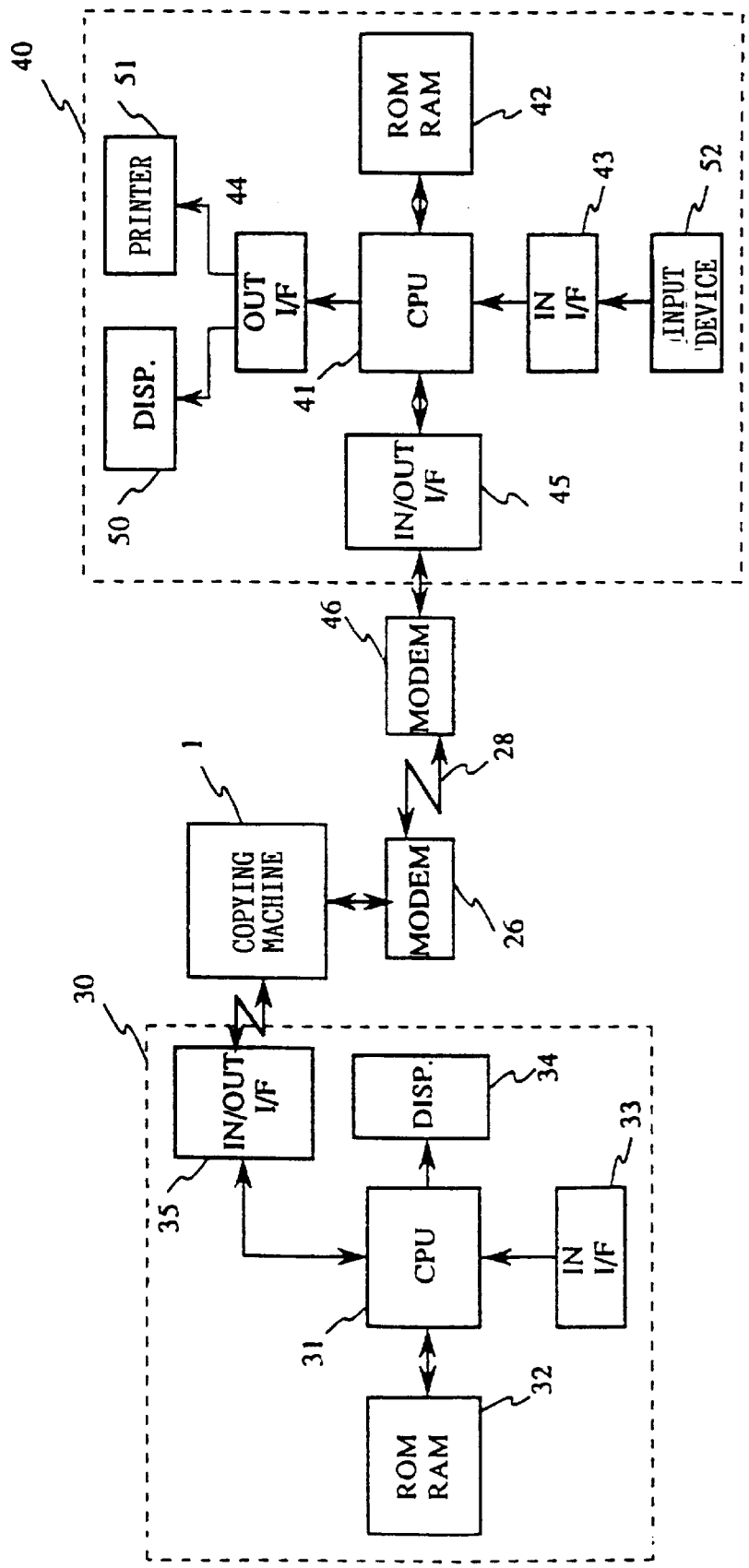
FIG. 3 is a block diagram showing a structure of a portable terminal device 30 incorporated in the maintenance control apparatus and a structure of a host computer 40.

FIG. 3 is a block diagram showing a structure of a portable terminal device 30 which is included in a maintenance control apparatus of the first embodiment of the invention and a structure of a host computer 40. The portable terminal device 30 provides a CPU 31 having a memory 32 including a ROM and a RAM. An input part 33 comprising each kind of key switch operated by an operator and a display part 34 for displaying a guidance on the maintenance operation are connected to the CPU 31. In addition, the CPU 31 provides an input and output interface 35 through which the CPU 31 is connected to the CPU 21 of the copying machine 1 described above.

The host computer 40 installed at the control center provides a CPU 41 having the memory 42 which includes a RAM and a ROM. The memory 42 memorizes the maintenance data of the copying machine 1. The maintenance data includes data indicative of an operation procedure for the maintenance for each type of the copying machine 1, an operation history and a maintenance history of each copying machine. The maintenance data memorized in the memory 42 will be described in detail later. An input device 52 is connected to the CPU 41 via an input interface 43. A display 50 and a printer 51 are connected to the CPU 41 via an output interface 44. A modem 46 is connected to an input and output interface 45. The CPU 41 is connected to a public telephone circuit 28 via the input and output interface 45 and the modem 46 so that the CPU 41 transmits and receives data to and from the CPU 21 of the copying machine 1 via the public telephone circuit 28. Incidentally, the public telephone circuit 28 is one example of the data communication circuit, and a dedicated communication circuit may be used instead.

Figure 4:
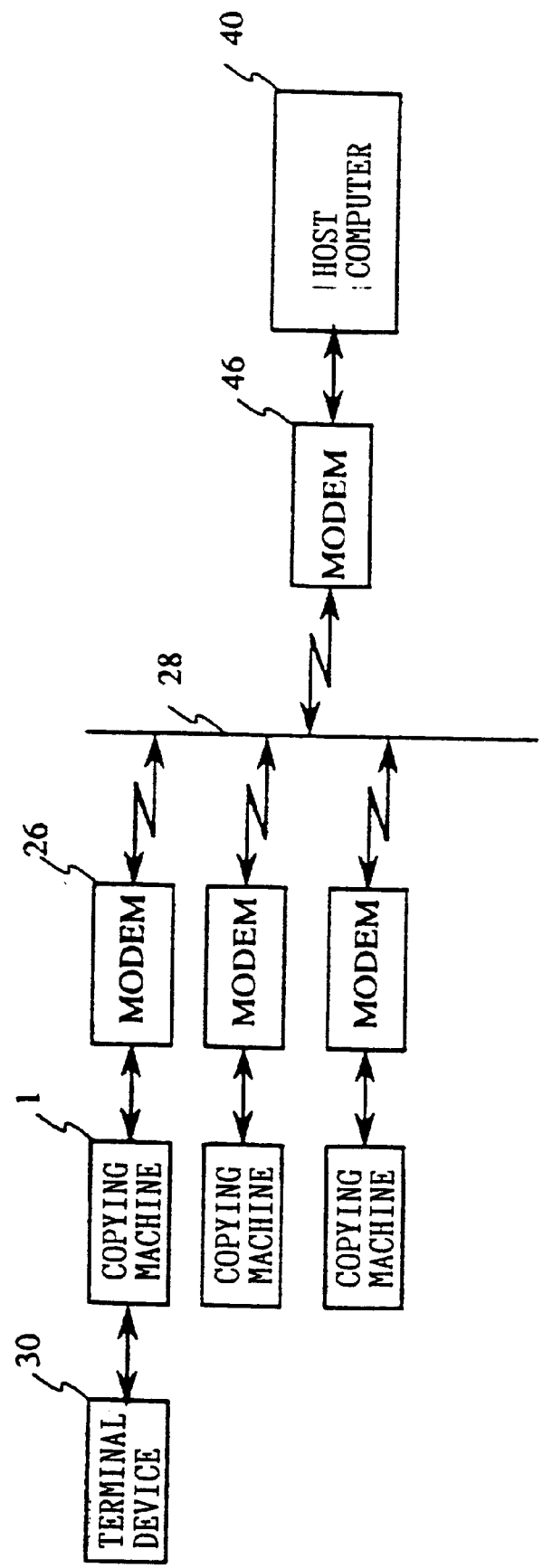
FIG. 4 is schematic view showing an overall structure of the maintenance control apparatus.

FIG. 4 is a schematic view showing an overall structure of the maintenance control apparatus. A plurality of copying machines 1 installed at each user are connected to the public telephone circuit 28 via the modem 26 respectively. The host computer 40 at the control center is connected to this public telephone circuit 28 via the modem 26. Each of the copying machines 1 transmits and receives data to and from the host computer 40 via the public telephone circuit 28. In addition, a portable terminal device 30 is connected to the copying machine 1 which is to be maintained and serviced by the operator. This portable terminal device 30 transmits and receives data to and from the host computer 40-via the copying machine 1 which is connected to the portable terminal device 30.

FIG. 5A shows data for each copying machine out of the maintenance data which is memorized in the memory 42 of the host computer 40. Furthermore, FIG. 5B shows data for each type of copying machine out of the maintenance data.

As data which is determined for each copying machines, identification data, an operation history and a maintenance history are determined. The identification data comprises the type name which is an object of maintenance control, and a subsequently number individually set for each copying machine such as, for example, a manufacture number or the like. It never happens that the same number is used more than once. The operation history refers to data for indicating an operation amount of the copying machine 1. For example, a jamming counter for indicating the frequency of jamming at each place of jamming, and a paper feeding counter for indicating the number of fed sheets of paper are memorized. Every time a count value provided on each counter indicates a predetermined value, the performance of the maintenance operation is promoted. As the maintenance history, a count value of each counter is stored when the maintenance operation is performed.

As data which is determined for each type of copying machine, a type name, item data D1, item data D2, and state data, guidance data and a counter value which requires the maintenance are determined. Data such as the item data D1 and the item data D2 are determined corresponding to the type name which is an object of the maintenance control. The item data and the guidance data constitutes operation data.

For example, in type [SD-2060], for example, as the item data D1, the adjustment of the paper-feeding part and the cleaning of the optical part are determined for each item of maintenance. The maintenance data D1 at the time of the selection of the adjustment of the paper-feeding part is memorized in the item data D2. As the item data D2, the blow-out air pressure is to be adjusted. The adjustment method at the time of the adjusting the blow-out air pressure is memorized as guidance data.

In correspondence to the item data D2, a counter value which requires the maintenance is determined. When the count value exceeds a predetermined level, the corresponding item data D2 is transmitted to promote the execution of the maintenance. For example, in the case where the paper feeding counter value exceeds 2000 at the time of the execution of the maintenance, the item of the adjustment of the blow-out air pressure is indicated as an item of operation. In each of the item data D2, a method for adjusting a part which is related to the item is memorized as guidance data.

Furthermore, irrespective of the item data D2, the item data D1 includes the state data. The state data refers to data which is input into the portable terminal device 30 by the operator who performs the maintenance. When it is judged that the cleaning of the paper-feeding roller is required on the basis of the data input by the operator, the corresponding cleaning method is provided from the host computer 40 to the portable terminal device 30 as guidance data.

Figure 6:
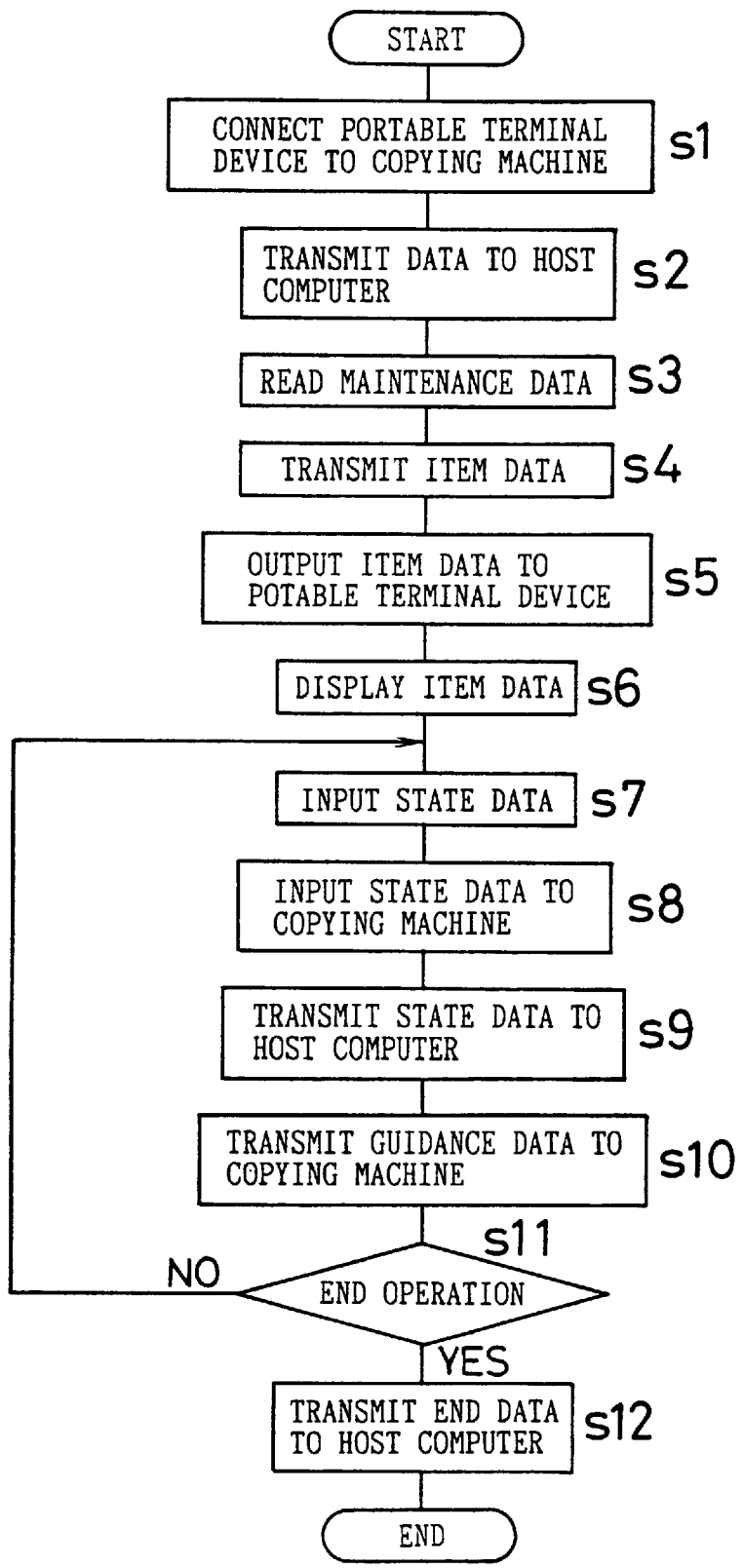
FIG. 6 is a flowchart showing a processing procedure at the time of the maintenance control operation in the maintenance control apparatus of the first embodiment.

FIG. 6 is a flowchart showing a processing procedure at the time of the maintenance control operation in the maintenance control apparatus of the first embodiment of the invention. When the operator performs an operation such as a service operation or the like associated with a regular maintenance operation and trouble shooting, at the outset, the portable terminal device 30 is connected to the copying machine 1 at step s1. At step s2, upon detecting that the portable terminal device 30 has been connected to the copying machine 1, the copying machine 1 transmits to the host computer 40 identification data including such data as a type name, a control number or the like together with data indicative of the fact that the portable terminal device 30 has been connected to the copying machine 1. At step s3, the host computer 40 reads the identification data included in the data to select and read data corresponding to the type name and the operation history specified by the identification data out of the maintenance data which is memorized in the memory 42. At step s4, the host computer 40 transmits the read data to the copying machine 1 as item data. At step s5, the copying machine 1 outputs the received item data to the portable terminal device 30.

At step s6, the portable terminal device 30 displays on the display part 34 item data output from the copying machine 1. At step s7, the operator inputs to the portable terminal device 30 the state data indicative of a trouble state and an operation state or the like which is actually obtained from the copying machine 1. At step s8, the portable terminal device 30 inputs the state data input by the operator to the copying machine 1. At step s9, the copying machine 1 transmits this state data to the host computer 40. At this time, the detection state data indicative of the operation state of the copying machine 1 detected by each sensor provided on the copying machine 1 is also transmitted to the host computer 40. At step s10, the host computer 40 selects and transmits the guidance data out of the maintenance data, the guidance data being indicative of a procedure for the operation which should be performed by the operator on the basis of the transmitted state data and the detection state data. At step s11, it is judged whether the operator inputs an instruction indicative of the end of the maintenance control operation. Transmitting and receiving of the state data and the guidance data between the copying machine 1 and the host computer 40 continues until the operator inputs the instruction indicative of the end of the operation to the portable terminal device 30. When the operator inputs an instruction indicative of the end of the operation, the end data is transmitted to the host computer 40 via the copying machine 1 at step s12.

FIGS. 7A to 7D show display examples of the portable terminal device 30 at the time of the maintenance control operation. As a paper-feeding mechanism of the copying machine 1, either an air paper-feeding mechanism or a roller paper-feeding mechanism is provided on each type of copying machine 1. The host computer 40 judges the type of the copying machine 1 to which the portable terminal device 30 is connected on the basis of the identification data transmitted from the copying machine 1. For example, in the case where the copying machine 1 with which the maintenance control operation is performed provides the air paper-feeding mechanism, item data on the air paper-feeding mechanism is transmitted to the copying machine 1.

The host computer 40 determines which item data is to be transmitted to the copying machine 1 on the basis of the state data and the count value which is memorized in the memory 42. The item data which is transmitted to the copying machine 1 is given to the portable terminal device 30. The display part 34 of the portable terminal device 30 displays on the basis of the item data the operation item with respect to the air paper-feeding mechanism as shown in FIG. 7A. Besides, in the case where the copying machine 1 with which the maintenance operation is performed provides a roller paper-feeding mechanism, the host computer 40 transmits item data with respect to the roller paper-feeding mechanism to the copying machine 1. The portable terminal device 30 displays the operation item with respect to the roller paper-feeding mechanism as shown in FIG. 7B on the basis of the item data. In addition, the operation item is changed as shown in FIGS. 7C and 7D in accordance with the operation history, the maintenance history or the like of the copying machine 1 with which the operation is performed.

As described above, according to the first embodiment, since operation data including the item data and the guidance data can be transmitted from the host computer 40 to the portable terminal device 30 which is connected to the copying machine 1, the operation data is not required to be memorized in the portable terminal device 30 in advance so that the memory capacity of the memory 32 can be reduced. In addition, since the host computer 40 analyzes the state data input to the portable terminal device 30 and the detected state data detected by a sensor provided on the copying machine 1 to transmit the guidance data most suitable for the current state of the copying machine 1 to the portable terminal device 30, processing means for analyzing data is not required to be provided on the portable terminal device 30. At the same time, the operator is not required to carry a manual or the like which is needed for the maintenance, and the operator can perform an accurate operation in accordance with the display content displayed on the display part 34 of the portable terminal device 30. Furthermore, since the copying machine 1 itself transmits the identification data to the host computer 40, the operator reads the identification data from the copying machine 1 to save the trouble of inputting the data to the portable terminal device 30.

Incidentally, according to the first embodiment, the copying machine 1 detects that the portable terminal device 30 is connected to the copying machine 1 so that the identification data is transmitted from the copying machine 1 to the host computer 40. However, the identification data may be transmitted in response to the start of operation provided from the portable terminal device 30 after the portable terminal device 30 is connected to the copying machine 1.

Figure 8:
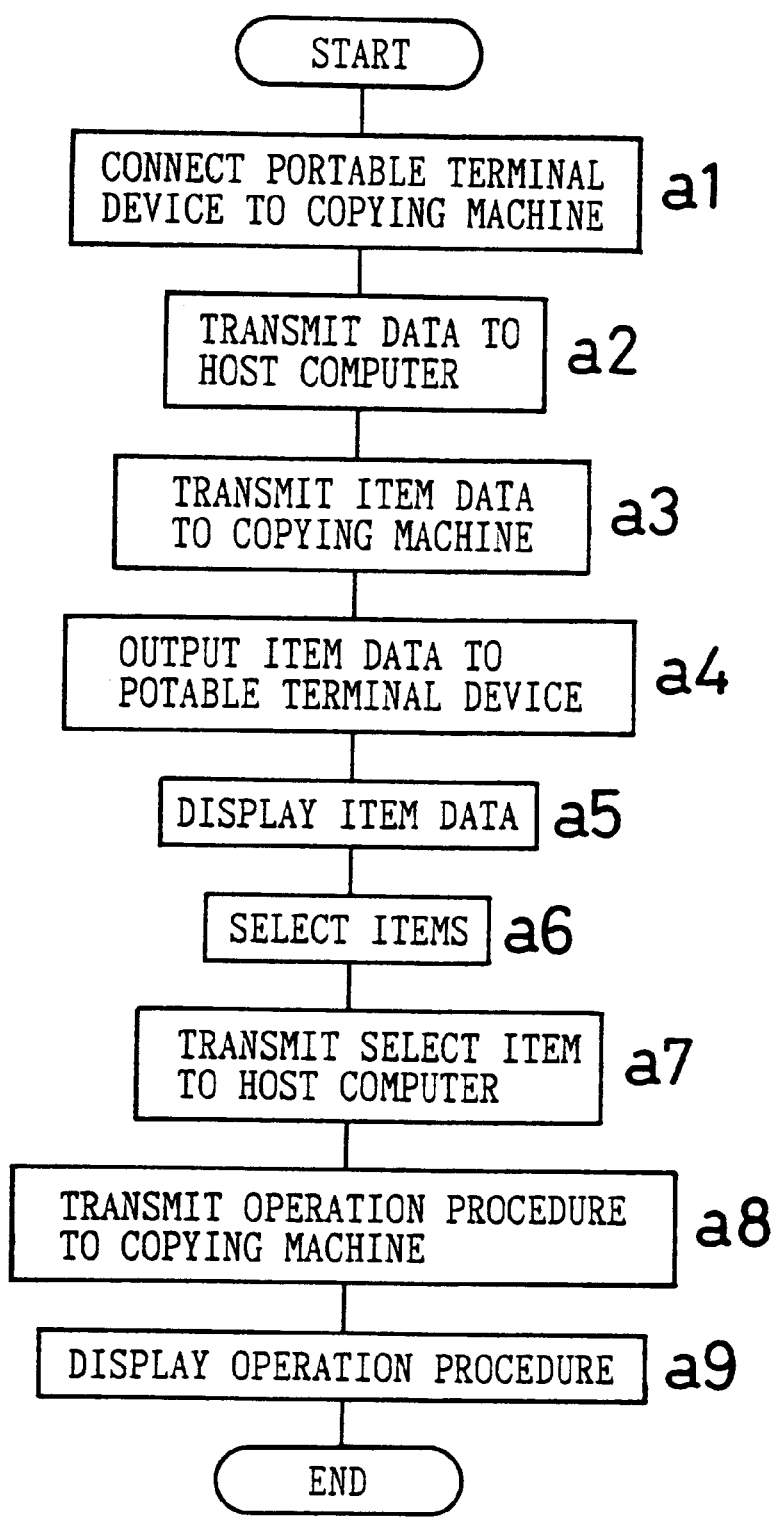
FIG. 8 is a flowchart showing a processing procedure at the time of the maintenance control operation in the maintenance control apparatus of a second embodiment of the invention.

FIG. 8 is a flowchart showing a processing procedure at the time of the maintenance control operation in the maintenance control apparatus of a second embodiment of the invention. Steps a1 and a2 are the same processing as Steps S1 and S2 in FIG. 6. The host computer 40 which has received the identification data and data indicating that the portable terminal device 30 has been connected to the copying machine 1 transmits at step a3 item data of a plurality of the maintenance operation which should be performed at the copying machine 1. At step a4, the copying machine 1 outputs the received item data to the portable terminal device 30. At step a5, the portable terminal device 30 displays the item data of the maintenance operation which should be performed. At step a6, the operator selects and inputs items whose operation procedure is what the operator wishes to know out of the displayed items. At step a7, the selected and input items are transmitted to the host computer 40 via the copying machine 1. The host computer 40 retrieves the operation procedure of the selected and input items in the maintenance data and the host computer 40 transmits the guidance data indicative of the operation procedure to the copying machine 1 at step a8. The copying machine 1 outputs the guidance data to the portable terminal device 30, and, at step s9, the display part 34 of the portable terminal device 30 displays the content of the guidance data as the operation procedure.

FIGS. 9 and 10 show display examples of the portable terminal device 30 in the maintenance control apparatus of the second embodiment of the invention.

According to the second embodiment, the host computer 40 transmits to the copying machine 1 a plurality of item data depending on the type to the copying machine 1. For example, when the type of the copying machine 1 is [SD-2060], the display part 34 of the portable terminal device 30 displays item data such as "an initial screen adjustment", "a paper-feeding part adjustment", "the exchange of the developer", "the exchange of the drum" and "the cleaning of the optical part".

When any value corresponding to each item data is input to the portable terminal device 30, the operation procedure with respect to the item data is given to the portable terminal device 30 via the copying machine 1 from the host computer 40.

Figure 10A:
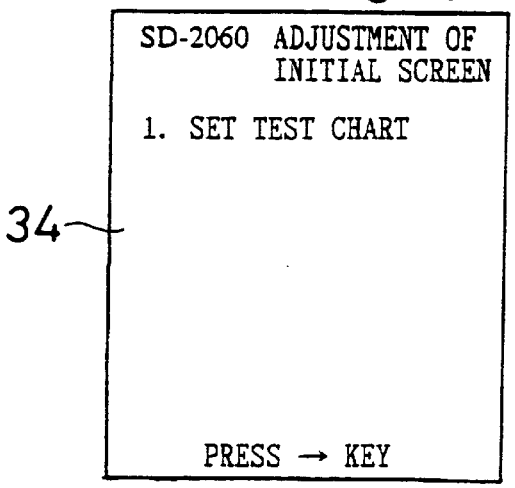
FIGS. 10A to 10F are views showing other display examples of the terminal device 30 at the time of the maintenance control operation in the maintenance control apparatus of the second embodiment.
Figure 10B:
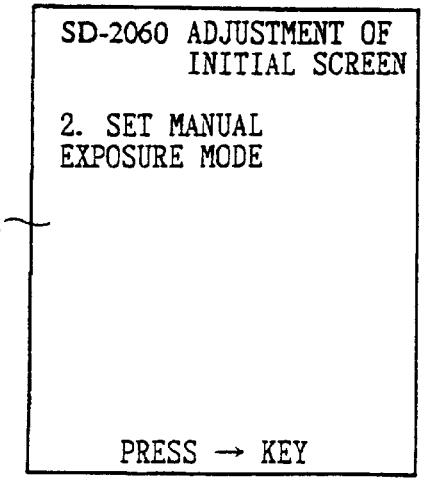
Figure 10C:
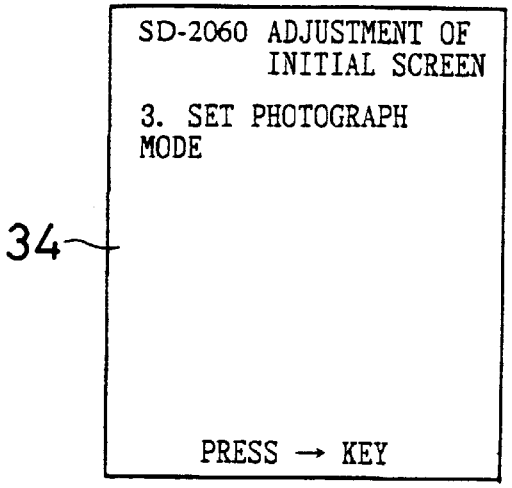
Figure 10D:
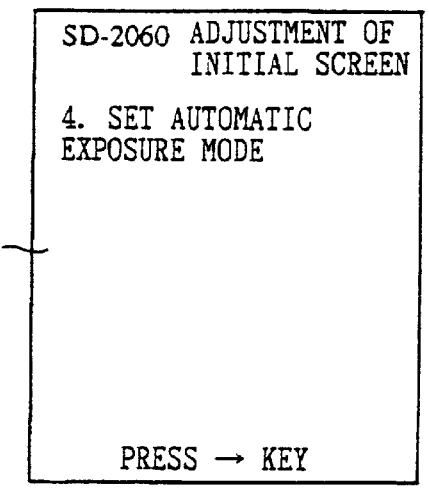
Figure 10E:
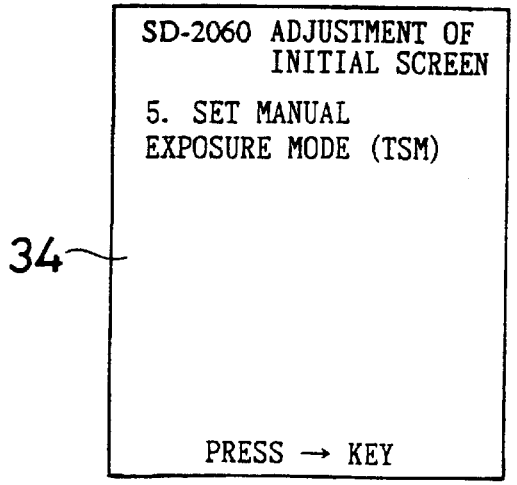
Figure 10F:
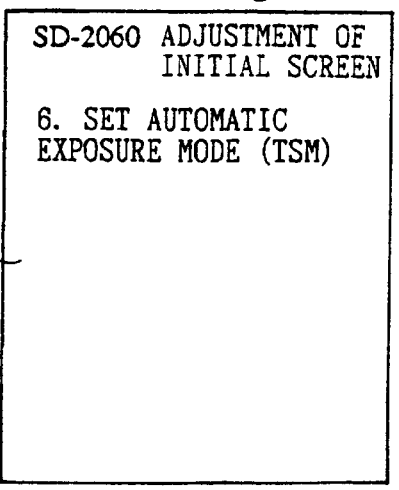

When the initial screen adjustment is selected from the display state shown in FIG. 9, a display state shown in FIG. 10A is provided. In FIG. 10A, a setting method of the test chart is displayed. A right-pointing arrow key provided on the portable terminal device 30 is pressed from the display state of FIG. 10A to give an instruction of the change-over in to the subsequent display state, the display state shown in FIG. 10B is provided. Thereafter, the display state is changed over in an order of FIG. 10C to FIG. 10D to FIG. 10E to FIG. 10F every time an instruction is given for the changing over the display state.

In the flowchart, the operation procedure is displayed on the display part 34 of the portable terminal device 30 to end the processing. However, the embodiment may be constituted so that the process returns to step s23 again to display the item data and select the item after the desired operation procedure is displayed.

As described above, according to the second embodiment, the operator can be acquainted with the maintenance operation items which should be performed with respect to the copying machine 1. With respect to items whose operation procedure is unclear to the operator, the operator can refer to the guidance transmitted from the host computer 40 so that he is able to perform the maintenance operation and to accomplish surely the operation that should be performed with respect to the copying machine 1.

Figure 11:
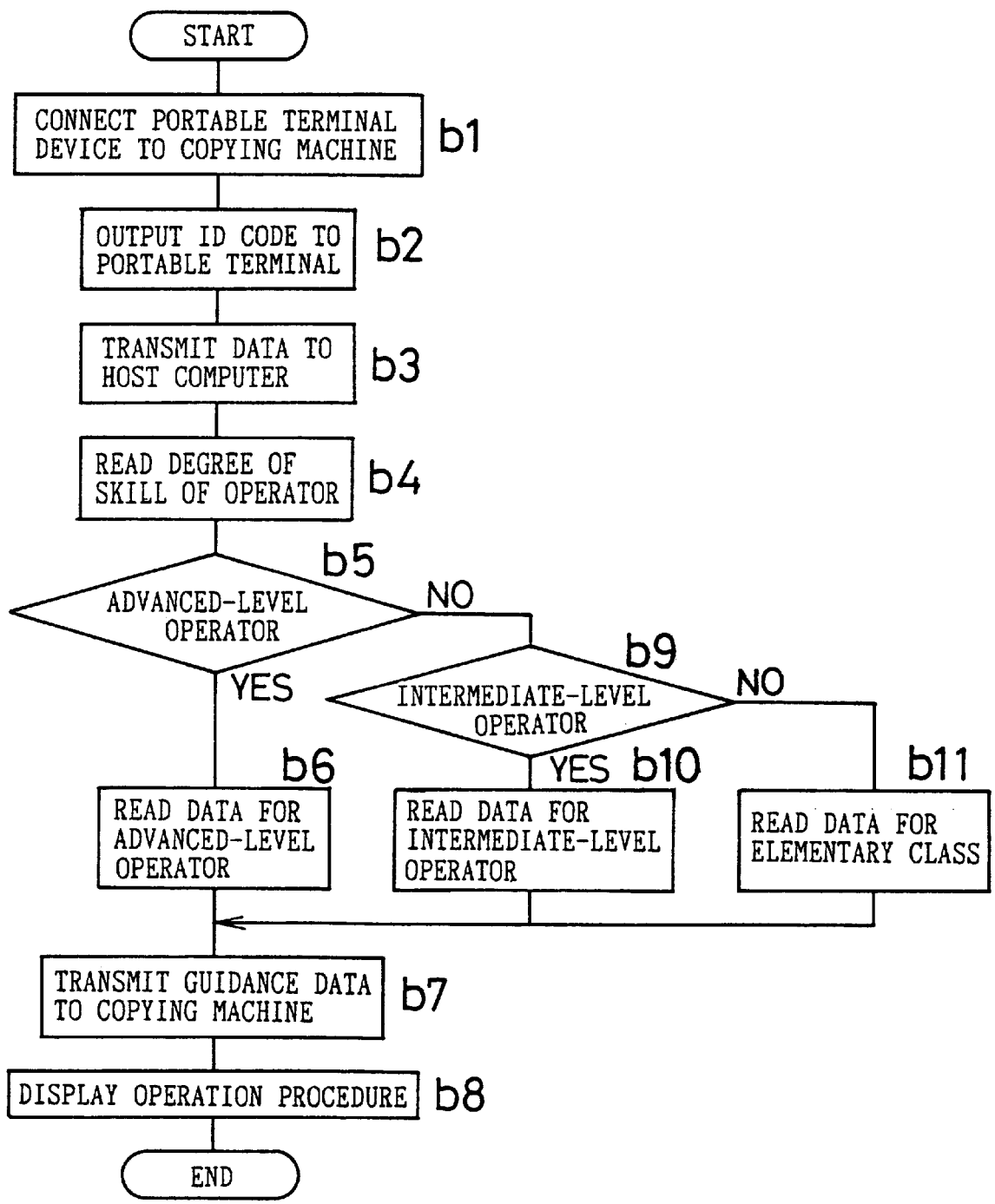
FIG. 11 is a flowchart showing a processing procedure at the time of the maintenance control operation in the maintenance control apparatus of a third embodiment of the invention.

FIG. 11 is a flowchart showing a processing procedure at the time of the maintenance control operation in the maintenance control apparatus of a third embodiment of the invention. After the operator connects the portable terminal device 30 to the copying machine 1 at step b1, the operator inputs his own ID code to the portable terminal device 30 at step b2. At step b3, the copying machine 1 transmits this ID code to the host computer 40 together with the identification data and data indicating that the portable terminal device 30 have been connected. The host computer 40 memorizes data on the level of the skill of each operator together with his ID code. Furthermore, as the maintenance data, each kind of data for the elementary level, the intermediate level and the advanced level is memorized in accordance with the level of the skill of the operator. At step b4, the host computer 40 reads the level of the skill of the operator by referring to the ID code which is transmitted from the copying machine 1.

At step b5, when it is judged that the level of the skill of the operator is advanced, the process proceeds to step b6. At step b6, the guidance data for the advanced level is read. At step b7, the read guidance data is transmitted to the copying machine 1. The guidance data transmitted to the copying machine 1 is given to the portable terminal device 30. At step b8, the display part 34 of the portable terminal device 30 displays the guidance data.

When it is judged that the level of the skill of the operator is not advanced, the process proceeds to step b9. At step b9, it is judged whether or not the level of the skill of the operator is intermediate. When the level of the skill of the operator is intermediate, the guidance data for the intermediate level is read at step b10. On the other hand, when the level of the skill of the operator is not intermediate, the guidance data for the elementary level is read. After the guidance data is read, the processing after step b7 is performed.

The third embodiment is characterized in that the operation procedure displayed on the display part 34 of the portable terminal device 30 is determined in accordance with the operation level of the operator who performs the maintenance control operation.

The operation level of the operator is determined on the basis of the frequency of performing the maintenance with respect to each unit which is an object of the maintenance, such, as for example, a paper-feeding unit and a paper transferring unit. Besides, the operation level may be determined on the basis of the experience years of the maintenance operation and the estimation test on the level of the skill. A plurality of conditions may be combined to determine the operation level.

In the aforementioned explanation using the flowchart, the operation level is classified into three stages; the advanced level, the intermediate level and the elementary level, but the level can be classified into a larger number of levels.

Figures 12A, 12B, 12C:
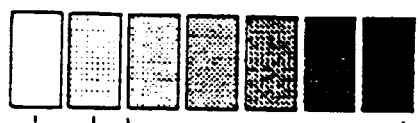
FIGS. 12A to 12C are views showing display examples of the portable terminal device 30 at the time of the maintenance control operation of the third embodiment.

FIGS. 12A to 12C show display examples of a portable terminal device 30 in the maintenance control apparatus of the third embodiment of the invention. In the case where an operator having an advanced operation level performs the maintenance control operation, the display shown in FIG. 12 A is provided. In FIG. 12A, procedures 1 through 2 are displayed as the operation procedure at the time of the image adjustment. In procedure 19 a program is performed for adjusting the image quality. Since the advanced-level operator can adjust the image by judging what the tone of B should be from an expression that the execution result of the program overlaps part B of the image adjustment chart in procedure 2, no procedure after procedure 2 is displayed.

In the case where an operator having an intermediate operation level engages in the maintenance control operation, the display of FIG. 12B is provided subsequent to the display of FIG. 12A so that procedures 1 through 3 are displayed. Although the intermediate-level operator can judge what the tone of B should be in procedure 2, there is a possibility that the method for adjusting the image is obscure. Since the adjustment method is displayed as the procedure 3, the image quality can be adjusted.

In the case where an operator having an elementary operation level engages in the maintenance control operation, a display of FIG. 12C is provided subsequent to the displays of FIGS. 12A and 12B. Procedures 1 through 4 are displayed. In the case of the elementary-level operator, there is a possibility that the method for adjusting the image is obscure and the tone level of B is obscure, an example of the tone is given as the procedure 4. It is possible to confirm the adjustment state of the tone as well as the adjustment method so that the image quality can be adjusted with certitude.

As described above, according to the third embodiment, the operator can refer to the guidance corresponding to the level of his own skill thereby preventing too detailed guidance from being shown to the advanced-level operator so that no communication time and communication cost is wasted while, on the other hand, preventing too simple guidance from being displayed to the elementary-level operator so that the operation content does not become unclear. In this manner, the operator can perform the maintenance control operation easily and surely. As a consequence, the communication cost to the advanced-level operator can be reduced, and the quality of the maintenance operation can be uniformed. Besides, the device and the method of the invention can be used for the control of operators.

Figure 13:
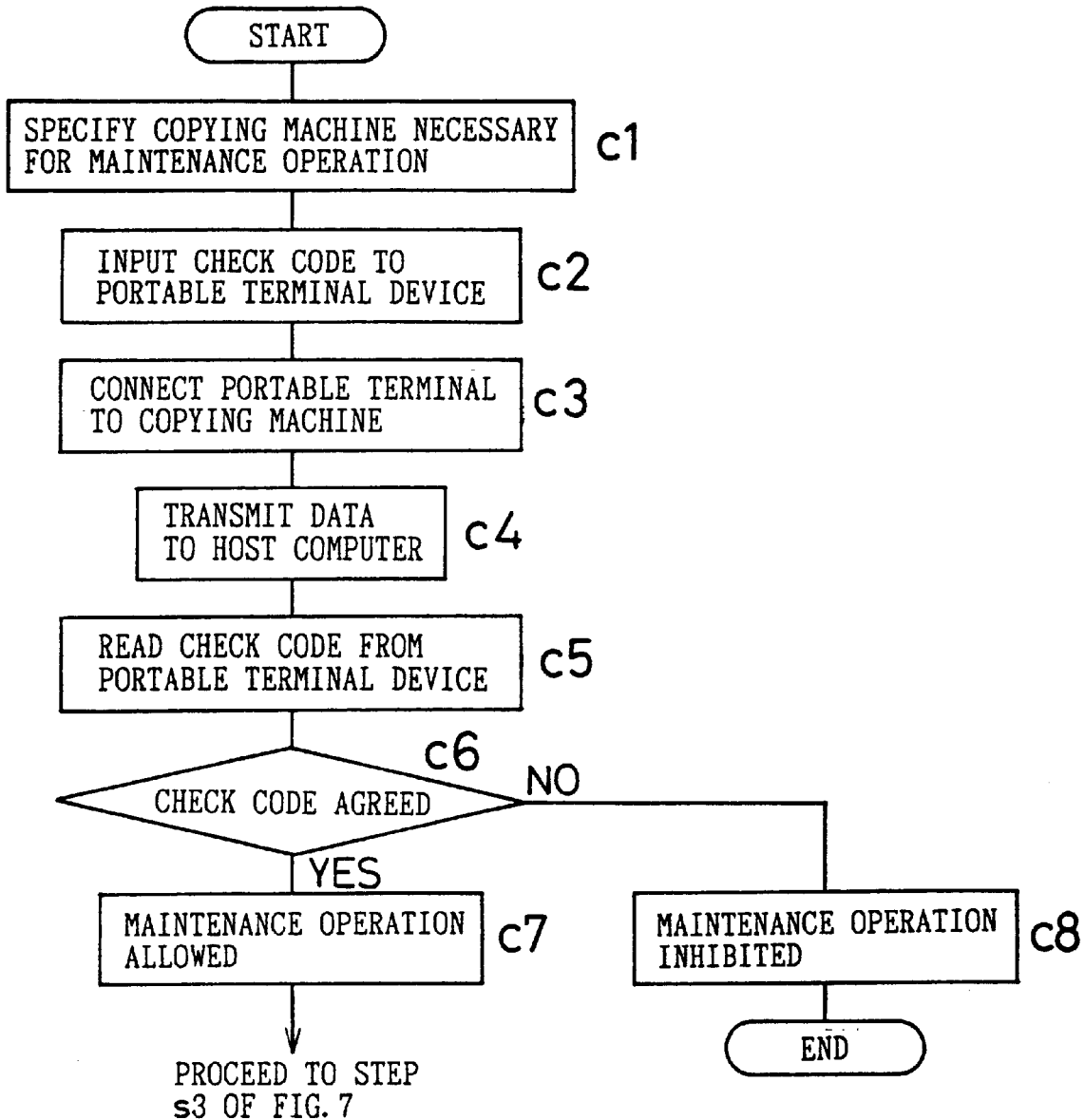
FIG. 13 is a flowchart showing a processing procedure at the time of the maintenance control operation in the maintenance control apparatus of a fourth embodiment.
Figure 14:
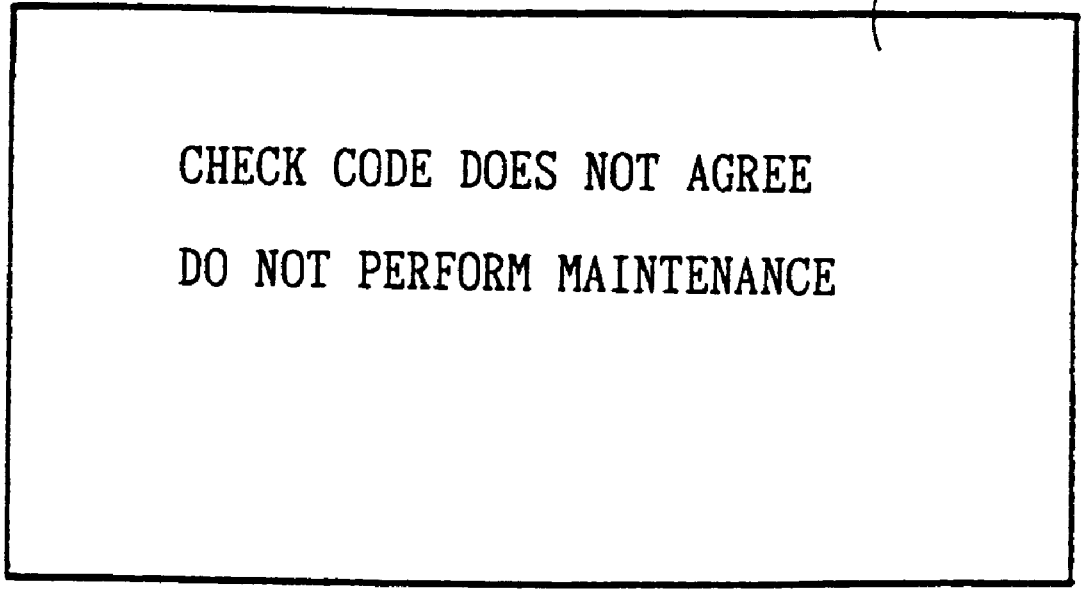
FIG. 14 is a view showing a display example of the portable terminal device 30 at the time of the maintenance control operation in the maintenance control apparatus of the fourth embodiment.

FIG. 13 is a flowchart showing a processing procedure at the time of operation in the maintenance control apparatus of a fourth embodiment of the invention. FIG. 14 shows a display example of the portable terminal device 30 of the maintenance control apparatus. The processing shown in this flowchart corresponds to a processing prior to the processing shown in the flowchart of FIG. 6. At step c1, the operator refers to the maintenance data in each copying machine 1 to specify the copying machine 1 which requires a regular maintenance and the copying machine 1 which obliges us to call a service man for the maintenance control. A check code is attached to each of the copying machines 1. At step c2, the operator inputs the check code of the copying machine 1 which is determined to be subjected to the maintenance. After the input of the check code, at step c3, the operator who arrives at the copying machine 1 which is an object of the maintenance connects the portable terminal device 30 to the copying machine 1. At step c4, the copying machine 1 to which the portable terminal device 30 is connected transmits to the host computer 40 the identification data and data indicating that the portable terminal device is connected at step c4.

At step c5, the host computer 40 which has received the data reads the check code which is memorized in the portable terminal device 30 via the copying machine 1. At step c6, the host computer 40 judges whether the read check code agrees with the check code specified by the identification data. When the check code read from the portable terminal device 30 agrees with a check code memorized as part of the maintenance data, the process proceeds to step c7. At step c7, the performance of the maintenance operation is allowed. After the performance of the maintenance operation is allowed, processing after step s3 in FIG. 6 is performed. In the case where the maintenance operation is inhibited because of the disagreement of the check codes, reading of data in the copying machine 1 by the portable terminal device 30 and key input in the portable terminal device 30 are inhibited at step c8. In addition, an instruction is given to the copying machine 1 to ignore the operation of switches, volumes and the like for each kind of adjustment. The portable terminal device 30 displays a guidance shown in FIG. 14.

As described above, according to the fourth embodiment, the operator is surely prevented from performing the maintenance operation by mistake with respect to the copying machine 1 which does not require the maintenance. Thus, a disorder can be prevented which might be generated as a result of the performance of an unnecessary operation.

Figure 15:
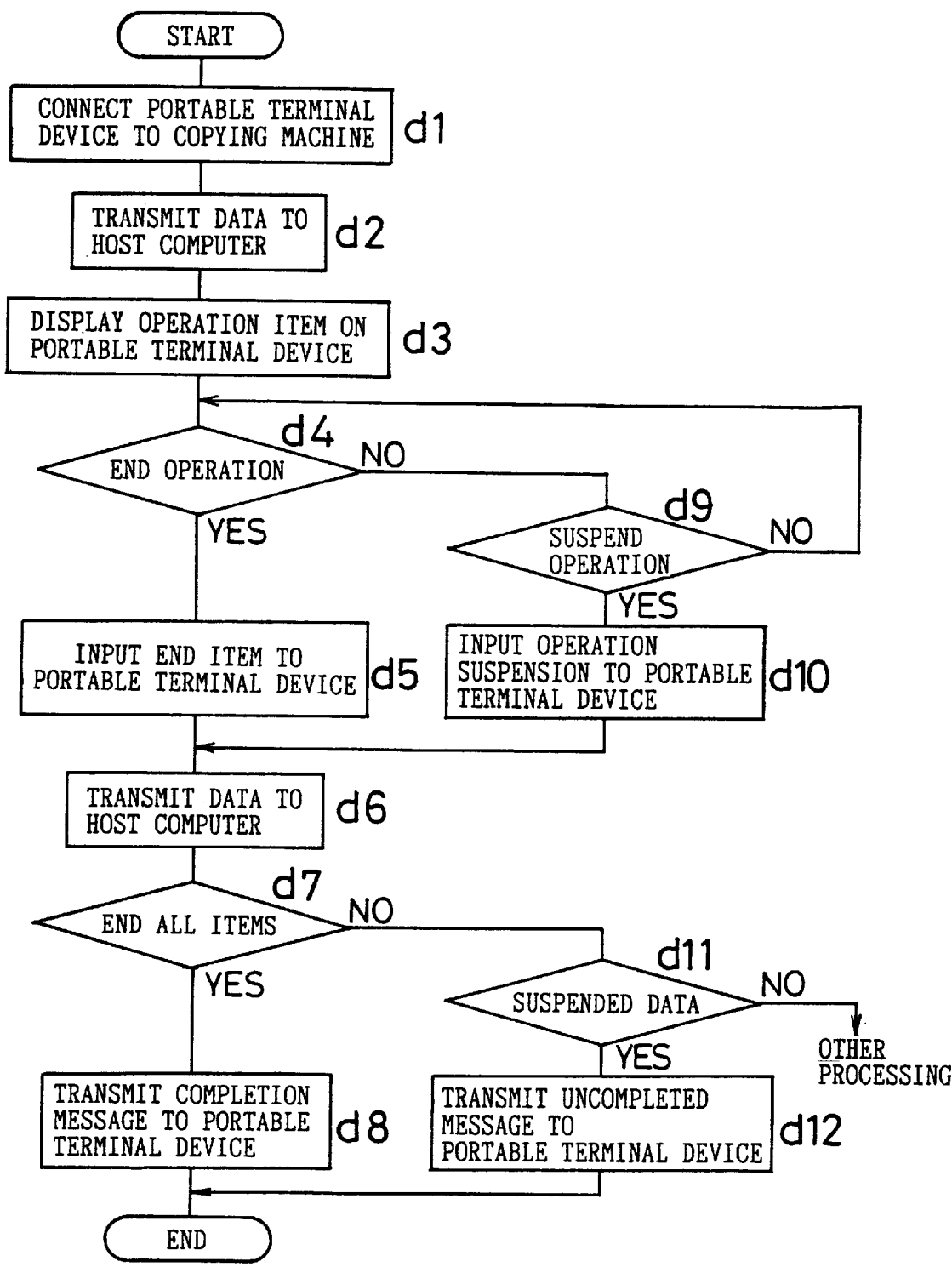
FIG. 15 is a flowchart showing a processing procedure at the time of the maintenance control operation in the maintenance control apparatus of a fifth embodiment of the invention.

FIG. 15 is a flowchart showing the processing procedure at the time of the maintenance operation in the maintenance control apparatus of a fifth embodiment of the invention. Steps d1 and d2 are the same processing as steps s1 and s2 shown in FIG. 6.

The host computer 40 provides operation items which should be an object of the maintenance to the portable terminal device 30 via the copying machine 1 on the basis of the transmitted data. At step d3, the portable terminal device 30 displays the operation items. At step d4, it is judged whether or not the operation is ended. In the case where one item of operation is ended, the process proceeds to step d5. At step d5, every time each item of operation is ended, an item which has been ended is input to the portable terminal device 30. At step d6, the portable terminal device 30 prepares end data with respect to the input items, and transmits the data to the host computer 40 via the copying machine 1. At step d7, the host computer 40 compares the content of the list of operation items which are transmitted to the portable terminal device 30 with the end data to judge whether or not the operator has ended the operation with respect to all the items which should be performed. In the case where all the operation items which should be performed are ended, the process proceeds to step d8. At step d8, the host computer 40 transmits to the portable terminal device 30 a message that the maintenance operation has been completed.

In the case where the operation is not ended at step d4, the process proceeds to step d9. At step d9, it is judged whether or not the operation is suspended. In the case where the operation is not suspended, the process proceeds to step d4. In the case where part of the operation items which should be performed cannot be performed owing to the failure of parts and tools, the operator inputs the suspension of the operation to the portable terminal device 30 at step d10. At step d6, the portable terminal device 30 transmits the suspension data to the host computer 40 via the copying machine 1. When it is judged at step d7 that even one item out of the operation items are not ended, the process proceeds to step d11. When the host computer 40 receives the suspension data at step d11, the host computer 40 transmits a message that the operation is not completed to the portable terminal device 30 via the copying machine 1. When the host computer does not receive the suspension data, other processing is performed.

FIGS. 16A to 16E show display examples of the portable terminal device 30 of the maintenance control apparatus. For example, when an item indicating that the operator has ended the operation is selected in the portable terminal device 30 from a state in which the operation items are displayed as shown in FIG. 16A, a display shown in FIG. 16B is provided. Furthermore, when the operator inputs the end of operation, only the operation items which are not ended are displayed as shown in FIG. 16C. When the operator decides to suspend the operation and presses the "suspension" key from a display state shown in FIG. 16C, the portable terminal device 30 provides a display shown in FIG. 16D. When the operator selects and inputs the suspension of the operation, the display shown in FIG. 16E is provided to indicate which of the maintenance operations is not performed.

As described above, according to the fifth embodiment, in the case where the maintenance operation which should be performed ranges over many items, all these operation items can be surely accomplished so that the reliability of the maintenance operation is improved. Besides, the state of the performance of the maintenance operation can be grasped on the host computer, the transfer of the operation can be facilitated even when part of operation that should be performed cannot be performed due to the failure of the parts and tools.

Incidentally, all the aforementioned embodiments have been explained by citing an example of the copying machine. However, the invention can be embodied in other image forming apparatuses such as laser printers or the like. Besides, each form of the embodiments has been explained independently, a plurality of forms of embodiments may be embodied in combination with each other.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A maintenance control apparatus for electronic apparatuses each provided with a data communication function, the maintenance control apparatus comprising:

central control means for holding maintenance control data comprising information on each of a plurality of electronic apparatuses, each of the electronic apparatuses being identified in accordance with predetermined stored information, the central control means being connectable selectively to any of the electronic apparatuses through an associated data communication link;

portable maintenance terminal means selectively connectable to any of the electronic apparatuses and including memory means having limited memory capacity sufficient for storing received maintenance information needed for servicing at least one of the electronic apparatuses but insufficient for simultaneously storing maintenance information needed for servicing others of the plurality of electronic apparatuses;

detecting means for detecting identification information of one of the electronic apparatuses;

transmitting means for transmitting the detected identification information to the central control means through the data communication function of the one electronic apparatus and an associated one of the data communication links;

the central control means responding to the detected identification information to determine, from the stored maintenance data, operation data corresponding to the one electronic apparatus, and transmitting the operation data to the one electronic apparatus through the associated data communication link;

the portable terminal means further having:

receiving means for receiving the operation data from the one electronic apparatus; and display means for displaying selected data including the received operation data;

the portable terminal means receiving an operator input of state data indicative of at least the operating and trouble states of the one electronic apparatus, and transmitting the operator input state data to the one electronic apparatus;

the central control means receiving from the one electronic apparatus the operator input state data and state data detected by the one electronic apparatus; and the central control means determining maintenance guidance data on the basis of the state data, and transmitting the guidance data to the portable terminal means through the one electronic apparatus for operator use in servicing the one electronic apparatus;

whereby the portable terminal means can be used portably to provide needed servicing for any of the plurality of electronic apparatuses with the limited memory capacity of the memory means.

2. The maintenance control apparatus for the electronic apparatuses of claim 1, wherein the maintenance control data held in the central control means is classified for each function of the electronic apparatuses, selection data for selecting data from the maintenance control data is transmitted to the central control means from the transmitting means, and maintenance control data selected in accordance with the selection data is transmitted to the portable terminal means from the central control means.

3. The maintenance control apparatus for the electronic apparatuses of claim 1, wherein the maintenance control data held in the central control means is classified in stages according to an operation level determined for each operator who is to perform the maintenance control operation, and the maintenance control data corresponding to the operation level of the operator who is to perform the maintenance control operation is transmitted to the portable terminal means through the data link and the communication function of the electronic apparatus.

4. The maintenance control apparatus for the electronic apparatuses of claim 1, wherein one or a plurality of maintenance control information items which are to be maintained and controlled are input to the portable terminal means so that end information is thereafter transmitted to the central control means, the end information being indicative of the ending time of each maintenance control operation corresponding to the maintenance control information items, and whether the maintenance control operation which is to be performed has ended.

5. A method for maintaining and controlling electronic apparatuses each provided with a data communication function, the method comprising the steps of:

holding in central control means maintenance control data comprising information on the electronic apparatuses which are each identified in accordance with predetermined stored identification information, the central control means being connectable to the electronic apparatuses through respective data communication links;

connecting portable maintenance terminal means having memory means to a first electronic apparatus to be maintained and controlled, the memory means having limited memory capacity sufficient for storing received maintenance information needed for servicing at least one of the electronic apparatuses but insufficient for simultaneously storing maintenance information needed for servicing others of the plurality of electronic apparatuses;

detecting identification information of the first electronic apparatus;

transmitting the detected identification information to the central control means through the data communication function of the first electronic apparatus and a first data link;

generating in the central control means operation data corresponding to the first electronic apparatus on the basis of the identification data and the stored maintenance data;

transmitting the operation data to the portable terminal means through the first electronic apparatus;

receiving in the portable terminal means an operator input of state data indicative of at least the operating and trouble states of the first electronic apparatus, and transmitting the operator input state data to the first electronic apparatus;

processing in the central control means the operator input state data and state data detected by the first electronic apparatus to determine maintenance guidance data;

transmitting the maintenance guidance data to the portable terminal means through the first electronic apparatus for display and use in providing service for the one electronic apparatus;

whereby the portable terminal means can be used in the method to provide needed servicing for any of the plurality of electronic apparatuses with the limited memory capacity of the memory means.

6. The method of claim 5 for maintaining and controlling electronic apparatuses, wherein the maintenance control data held in the central control means is classified for each function of the electronic apparatus, selection data for selecting the maintenance control information is transmitted from the portable terminal means to the central control means, and maintenance control data selected in accordance with the selection data is transmitted from the central control means to the portable terminals means.

7. The method of claim 5 for maintaining and controlling electronic apparatuses, wherein the maintenance control data held in the central control means is classified in stages according to an operation level determined for each operator who is to perform the maintenance control operation, and the maintenance control data according to the operation level of the operator who is to perform the maintenance control operation is transmitted to the portable terminal means through the first data communication link and the first data communication function.

8. The method of claim 5 for maintaining and controlling electronic apparatuses, wherein the identification information of an electronic apparatus which will be an object of maintenance control is read from the central control means before the connection of the portable terminal means to the electronic apparatus to memorize in the portable terminal means, and the performance of the maintenance control operation is allowed when the identification number associated with the electronic apparatus to which the portable terminal means is connected agrees with the identification number memorized in the portable terminal means.

* * * * *